United States Patent [19]

Via

[11] Patent Number: 4,519,883

[45] Date of Patent: May 28, 1985

[54] SENSITIZATION OF GLYOXYLATE PHOTOINITIATORS USING A TERPHENYL COMPOUND

[75] Inventor: Francis A. Via, Yorktown Heights, N.Y.

[73] Assignee: Stauffer Chemical Company, Dobbs Ferry, N.Y.

[21] Appl. No.: 501,470

[22] Filed: Jun. 6, 1983

[51] Int. Cl.³ .............................................. C08F 2/50
[52] U.S. Cl. ........................... 204/159.15; 204/159.23; 430/926
[58] Field of Search ......................... 204/159.23, 159.15

[56] References Cited

U.S. PATENT DOCUMENTS

| | | | |
|---|---|---|---|
| 3,795,598 | 3/1974 | Yukuta et al. | 204/159.24 |
| 4,038,164 | 7/1977 | Via | 204/159.15 |
| 4,072,770 | 2/1978 | Ting | 204/159.15 |
| 4,167,464 | 9/1979 | George | 524/35 |
| 4,229,274 | 10/1980 | Carlblom | 204/159.15 |

OTHER PUBLICATIONS

Herkstrofter "Mechanisms of Photochemical—XXVIII" J. Amer. Chem. Soc. 86, 4537–4540 (1964).
Calvert et al. "Photochemistry" Wiley & Sons 1966, p. 310.

Primary Examiner—Lewis T. Jacobs
Assistant Examiner—A. H. Koeckert
Attorney, Agent, or Firm—Richard P. Fennelly

[57] ABSTRACT

Glyoxylate photoinitiators are sensitized for photoinitiation by the use of at least one terphenyl sensitizer.

14 Claims, No Drawings

SENSITIZATION OF GLYOXYLATE PHOTOINITIATORS USING A TERPHENYL COMPOUND

BACKGROUND OF THE INVENTION

1. Field of the Invention

The present invention relates to the sensitization of glyoxylate photoinitiators.

2. Description of the Prior Art

Glyoxylate photoinitiators are known compounds and possess the glyoxylate group (—C(O)—C(O)—O—) attached to suitable moieties which confer photoinitiator utility on the resulting compound. Compounds of this type are described in U.S. Pat. No. 4,038,164 to F. A. Via, which is incorporated herein by reference. That patent describes compounds of the formula

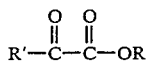

where R can be a straight or branched chain hydrocarbon (e.g. $C_1$–$C_{10}$ alkyl) of from one to ten carbon atoms, aryl, aralkyl, or mono-, di-, or trisilyl and R' is an aromatic heterocycle, aryl of from 6 to 14 carbon atoms, or mono-, di- or polysubstituted phenyl with such substituents as alkyl, alkoxy, aryloxy, alkylthio, arylthio and halogen. Preferably, R is alkyl and R' is phenyl. A commercial product of this type is sold under the trademark VICURE-55 by Stauffer Chemical Company and contains methyl phenyl glyoxylate as the photoinitiator.

SUMMARY OF THE PRESENT INVENTION

It has now been found that terphenyl compounds can function as effective sensitizers for the above-described glyoxylate photoinitiators.

DETAILED DESCRIPTION OF THE PRESENT INVENTION

The compositions curable by actinic radiation according to the invention can contain a polymerizable polymer in a reactive ethylenically unsaturated monomeric medium, a reactive polymer alone, a reactive monomer alone, or any of these combined with an inert solvent. Additionally, the polymerizable composition can contain any of the pigments commonly used in photopolymerization techniques.

The procedure can be carried out by mixing a quantity of photoinitiating compound of the present invention with a photopolymerizable composition and exposing the resultant mixture to actinic radiation. Alternatively, a one-component system comprising the photopolymerizable composition, the photoinitiator of the invention and, if desired, pigmentation, can be formed.

The photoinitiating compounds of the invention are suitable in the actinic light curing of unsaturated monomeric compounds either alone or as copolymerizable constituents of unsaturated polymer/monomer systems. Such systems are composed of mixtures of conventional unsaturated polymers and unsaturated monomers.

Monomers which are useful in practicing the invention are acrylic, α-alkacrylic and α-chloroacrylic acid compounds such as esters, amides and nitriles. Examples of such compounds are acrylonitrile, methacrylonitrile, methyl acrylate, ethyl acrylate, methyl methacrylate, isobutyl methacrylate, 2-ethylhexyl acrylate, methacrylamide and methyl α-chloroacrylate. Also useful, although not preferred due to their slower rates of reactivity, are vinyl and vinylidene esters, ethers and ketones. Additionally, compounds having more than one terminal unsaturation can be used. Examples of these include diallyl phthalate, diallyl maleate, diallyl fumarate, triallyl cyanurate, triallyl phosphate, ethylene glycol dimethylacrylate, glycerol trimethylacrylate, pentaerythritol triacrylate, pentaerythritol tetraarylate, trimethylolpropane triacrylate, methacrylic anhydride, and allyl ethers of monohydroxy or polyhydroxy compounds, such as ethylene glycol diallyl ether, pentaerythritol, tetraallyl ether, and the like. Nonterminally unsaturated compounds such as diethyl fumarate can similarly be used.

The acrylic acid derivates are particularly well suited to the practice of the invention and are consequently preferred components as monomers in monomer-containing polymerizable systems and as reactive centers in polymerizable polymers. While monomeric styrene can be used in the practice of the invention, it is not a preferred constituent of systems polymerizable thereby due to its slow rate of reaction.

A preferred manner of practicing the invention is by the use of photopolymerizable molding and coating compositions which comprise mixtures of unsaturated polymeric compounds and monomeric compounds copolymerizable therewith. The polymeric compounds can be conventional polyesters prepared from unsaturated polycarboxylic acids such as maleic acid, fumaric acid, glutaconic acid, itaconic acid, citraconic acid, mesaconic acid and the like, and polyhydric alcohols such as ethylene glycol, diethylene glycol, glycerol, propylene glycol, 1,2-butanediol, 1,4-butanediol, pentaerythritol, trimethylolpropane and the like. The carboxylic acid content can also contain saturated components. The inclusion of a monobasic fatty acid content, either as such or in the form of a triglyceride or oil, in the photopolymerizable polyester composition to comprise an alkyd resin is also acceptable. These resins can, in turn, be modified by silicones, epoxides, isocyanates, etc., by known techniques.

In accordance with the present invention the glyoxylate-containing photopolymerizable composition contains an effective amount (e.g., from about 0.1% to about 10%, by weight of the photopolymerizable composition) of a terphenyl compound to sensitize the initiator to photopolymerization. If desired, the terphenyl compound can contain one or more substituents on any of the phenyl rings including alkyl,alkoxy or halogen. Representative terphenyl compounds which are useful include p-terphenyl and, preferably, m-terphenyl.

Thus it is seen that the constitution of photopolymerizable compositions which can be used in the practice of the invention is widely variable. However, the compounds enumerated above are purely illustrative. Materials subject to polymerization by actinic radiation as well as permissible variations and substitutions of equivalent components within particular types of compositions are well known to those skilled in the art.

The glyoxylate photoinitiators can be utilized in amounts ranging from 0.01 to about 30% by weight based on the photopolymerizable composition. However, preferable amounts of the compounds are from about 0.5 to about 20 weight percent with optimal results being achieved with amounts in the range of from about 1.0 to about 16 weight percent.

An acceptable source of actinic light radiation is any apparatus which emits light radiation in the approximate region of from about 2000 Angstroms to about 8000 Angstroms and preferably from about 2400 Angstroms to about 5400 Angstroms. One such apparatus is PPG Model QC 1202, a UV processor, manufactured by PPG Industries, Inc.

The present invention is illustrated by the Examples which follow.

TEST PROCEDURE USED IN THE EXAMPLES

The induced rate of photopolymerization of a standard test solution of acrylate/alkyd resin was measured for each of the compounds tested. This standard test solution consisted of 42%, by weight, trimethylolpropane triacrylate (TMPTA), 17% by weight, of ethylhexyl acrylate (EHA), and 41%, by weight of an unsaturated long chain linseed oil alkyd resin (ACTOMER X-80 resin from Union Carbide).

The test solution was exposed to light radiation from a light source (PPG Model QC 1202) which contained two high intensity, medium pressure quartz mercury lamps, 12 inches in length, with each operating at a linear power density of about 200 watts per inch or 2400 watts per lamp. The lamps were housed in an elliptical reflector above a variable speed conveyor belt so that each lamp provided a 2-inch band of high flux actinic radiation on the conveyor. This 2-inch exposure area was bordered on both sides by an additional 2-inch area of medium flux energy for a total radiation area of 6 inches for each lamp. In the curing data presented herein, the cure rate of the polymerizable compositions is presented in feet-per-minute-per-lamp (ft./min./lamp). Thus, a conveyor belt speed of one foot/min. will, with a 12-inch exposure area for the two lamps, provide 60 seconds of exposure or a cure rate of 0.5 ft./min./lamp. Similarly, a belt speed of 10 ft./min. will provide 6 seconds of exposure or a rate of 5.0 ft./min./lamp, while a speed of 20.0 ft./min. will give 3 seconds exposure or a rate of 10 ft./min./lamp.

The extent of curing was determined by a standard pencil hardness test with all samples being coated on aluminum plate to a thickness of 2 mils and polymerized to achieve standard pencil hardness of from 4H to 6H where this was attainable.

EXAMPLES 1-3

In the following Examples the standard test solution was used with methyl phenyl glyoxylate being used as the photoinitiator at 4 wt. percent in all cases. The terphenyl compound was used at 1 wt. percent in all cases.

| Sensitizer | Cure Rate (ft/min/lamp) |
|---|---|
| None used (Control) | 14 |
| meta-terphenyl | 20 |
| para-terphenyl | 15 |

The foregoing Examples should not be construed in a limiting sense since they merely illustrate certain embodiments of the present invention. The scope of protection sought is set forth in the claims which follow.

What is claimed:

1. In the photopolymerization of monomeric and polymeric compositions of photopolymerizable substances wherein a photoinitiator is admixed with a photopolymerizable composition and the mixture exposed to actinic radiation, the improvement wherein photopolymerization is effectively initiated by a glyoxylate photoinitiator in the presence of a terphenyl compound sensitizer for said photoinitiator.

2. The method of claim 1 wherein the photoinitiator is of the formula

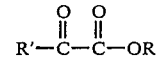

where R is lower alkyl and R' is phenyl.

3. The method of claim 1 wherein the photoinitiator is methyl phenyl glyoxylate.

4. The method of claim 1 wherein the terphenyl compound is meta-terphenyl.

5. The method of claim 1 wherein the terphenyl compound is para-terphenyl.

6. The method of claim 1 wherein the photoinitiator is methyl phenyl glyoxylate and the sensitizer is meta-terphenyl.

7. The method of claim 6 wherein the photoinitiator is present at from about 1.0 to about 16 weight percent of the photopolymerizable composition and the sensitizer is present at from about 0.1% to about 10% by weight of the photopolymerizable composition.

8. A composition photopolymerizable by actinic radiation comprising unsaturated polymerizable constituents containing dispersed therein an effective amount of a glyoxylate photoinitiator and a terphenyl compound sensitizer for said photoinitiator.

9. The composition of claim 8 wherein the photoinitiator is of the formula

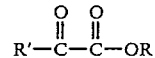

where R is lower alkyl and R' is phenyl.

10. The composition of claim 8 wherein the photoinitiator is methyl phenyl glyoxylate.

11. The composition of claim 8 wherein the terphenyl compound is meta-terphenyl.

12. The composition of claim 8 wherein the terphenyl compound is para-terphenyl.

13. The composition of claim 11 wherein the photoinitiator is methyl phenyl glyoxylate and the sensitizer is meta-terphenyl.

14. The composition of claim 13 wherein the photoinitiator is present at from about 1.0 to about 16 weight percent of the photopolymerizable composition and the sensitizer is present at from about 0.1% to about 10% by weight of the photopolymerizable composition.

* * * * *